United States Patent [19]
Kimura et al.

[11] 3,996,604
[45] Dec. 7, 1976

[54] VAPOR COOLED SEMICONDUCTOR DEVICE HAVING AN IMPROVED STRUCTURE AND MOUNTING ASSEMBLY

[75] Inventors: Yoshio Kimura; Hiroshi Mitsuoka, both of Amagasaki, Japan

[73] Assignee: Mitsubishi Denki Kabushiki Kaisha, Tokyo, Japan

[22] Filed: Jan. 30, 1975

[21] Appl. No.: 545,346

[30] Foreign Application Priority Data
Jan. 30, 1974   Japan ............................. 49-12985

[52] U.S. Cl. .................... 357/82; 357/79; 357/81; 165/80; 165/105; 317/100; 174/16 HS
[51] Int. Cl.² ............... H01L 25/04; H01L 23/42; H01L 23/44; H01L 23/46
[58] Field of Search ............... 357/79, 81, 82, 83; 165/80, 105; 317/100; 174/52, 16 HS

[56] References Cited
UNITED STATES PATENTS

| | | | |
|---|---|---|---|
| 2,886,746 | 5/1959 | Saby | 357/82 |
| 2,958,021 | 10/1960 | Cornelison | 357/82 |
| 3,654,528 | 4/1972 | Barkan | 357/82 |
| 3,736,474 | 5/1973 | Sias | 357/79 |
| 3,800,190 | 3/1974 | Marek | 357/82 |

FOREIGN PATENTS OR APPLICATIONS

| | | | |
|---|---|---|---|
| 32,389 | 10/1969 | Japan | 357/82 |
| 1,109,597 | 4/1968 | United Kingdom | 357 82/ |

OTHER PUBLICATIONS

IBM Technical Disclosure Bulletin, *Micro–Electronic Package*; by Bleher et al.; vol. 12, No. 5, Oct. 1969.

*Primary Examiner*—Andrew J. James
*Attorney, Agent, or Firm*—Oblon, Fisher, Spivak, McClelland & Maier

[57] ABSTRACT

A vapor cooled semiconductor device which comprises an envelope having at least one aperture, at least one semiconductor element enclosed therein, an electrode contacting the semiconductor element and exposed across the aperture of the envelope, an expandable diaphragm disposed through an insulator between the electrode and the wall of the envelope to seal the gap therebetween, spherical spring plates disposed outside the envelope and arranged to support the semiconductor element through the electrode under pressure, and a liquid coolant enclosed in the closed envelope, with space provided therein, whereby the semiconductor element may be cooled by the latent heat of vaporization of the liquid coolant.

9 Claims, 1 Drawing Figure

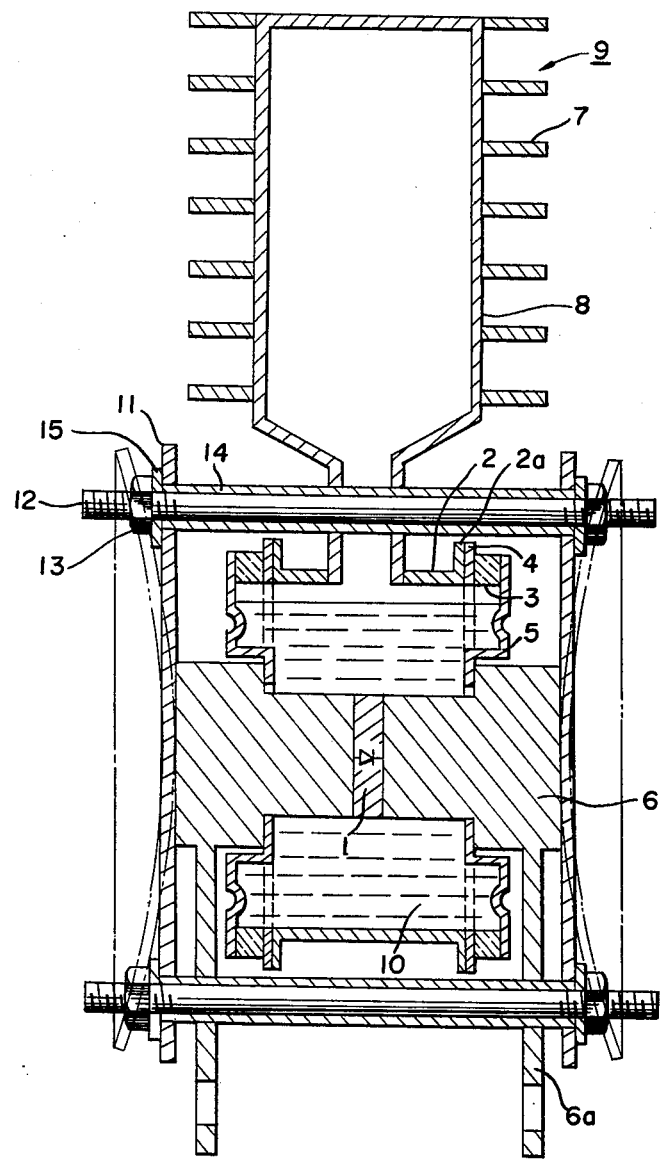

VAPOR COOLED SEMICONDUCTOR DEVICE HAVING AN IMPROVED STRUCTURE AND MOUNTING ASSEMBLY

BACKGROUND OF THE INVENTION

1. Field of the Invention

The present invention relates to a vapor cooled semiconductor device which cools a semiconductor element by utilizing the latent heat of vaporization of a liquid coolant.

2. Description of the Prior Art

As is known, the conventional vapor cooled semiconductor device comprises a liquid coolant which is enclosed in a closed envelope or container with given open space, whereby heat generated from a semiconductor dipped into the liquid coolant is radiated to an outer part by repeating vaporization and liquefication of the liquid coolant. The thermal conductivity in such cases is quite high, compared to those of air, oil, water, and the like, whereby the cooling efficiency to the semiconductor element is advantageously remarkably high.

In spite of the advantages for cooling the semiconductor element, however, the following disadvantages of the conventional devices have been found from the structural view point.

That is, in the conventional device, the semiconductor element is assembled in a stack comprising a metallic electrode, a radiator, an insulator, a pressing mechanism of a pressure plate and clamping bolts. The stack containing the semiconductor element is enclosed in the closed envelope. Accordingly, the number of parts of the device are large, the structure is complicated and the steps of manufacture are many and detailed. Further, the required pressure for the device increases, depending upon the increase of rating volume of the semiconductor element, and, accordingly, the size of the stack and the size of the closed envelope enclosing the stack are increased because of the mechanical strength requried for the pressing mechanism to be durable to the high pressures being generated. Of course, the amount of the liquid coolant enclosed in the closed envelope is increased.

As a result, the size of the whole device is increased and the weight of the device is also increased, and accordingly, the cost of the device is significant.

Moreover, in the conventional device, the whole part of the stack is enclosed in the closed envelope, whereby a terminal of the semiconductor element for current should be led out by an insulated and closed terminal disposed on the wall of the envelope, being insulated from the envelope. Therefore, the size of the device is further increased and the structure of the device is thus more complicated.

SUMMARY OF THE INVENTION

Accordingly, it is an object of the present invention to eliminate the disadvantages of the prior art, described herein.

It is also an object of the present invention to provide a new and improved vapor cooled semiconductor device which is simple in construction, small in size, light in weight and simplified in assembling.

It is another object of the present invention to provide a vapor cooled semiconductor device including an improved enclosed envelope which yet is small in size.

Another object of the invention is to provide a vapor cooled semiconductor device for easily feeding the current of a semiconductor element.

A further object of the invention is to provide a vapor cooled semiconductor device which supports a semiconductor element by an improved pressing mechanism.

The foregoing objects of the present invention are attained by providing a vapor cooled semiconductor device which comprises an envelope having at least one aperture, at least one semiconductor element enclosed in the envelope, an electrode which contacts the semiconductor element and is exposed across the aperture of the envelope, expandable sealing means disposed through an insulator between the electrode and the wall of the envelope to seal the gap therebetween, pressing means disposed in the outer part of the envelope to support the semiconductor element through the electrode under pressure, and a liquid coolant enclosed in the closed envelope with a space provided and which cools the semiconductor element by the latent heat of vaporization thereof.

BRIEF DESCRIPTION OF THE DRAWINGS

Various other objects, features and attendant advantages of the present invention will be more fully appreciated as the same becomes better understood from the following detailed description wherein:

The sole FIGURE is a sectional view of a preferred embodiment of a vapor cooled semiconductor device according to the present invention.

DETAILED DESCRIPTION OF THE PREFERRED EMBODIMENT

In the only FIGURE, the reference numeral 1 designates a plain semiconductor element such as, for example, a power diode. A longitudinally disposed metallic cylinder 2 having end flanges 2a projecting outwardly around each open end and having a hole centrally disposed in its peripheral wall is provided with a pair of annular insulators 3, made of ceramic or the like, being disposed one each at each open end of the metallic cylinder, facing the flange portions 2a, and a welded ring 4 is soldered on an end of each of the annular insulators while a diaphragm 5 is welded on the other end of each of the annular insulators, the diaphragm projecting substantially radially inwardly of the metallic cylinder. Electrodes 6 are inserted from both ends into a hole of central concavity defined by the diaphragms 5 and the part being inserted is then sealed. The electrodes are made of high electrical and thermal conductive material, such as, for example, copper, and form a current output terminal 6a at an exposed end and supports the semiconductor element 1 from both sides, and also may be used as a radiator.

A cooling cylinder 8 has a truncated lower portion and the lower aperture thereof is inserted and welded into the central hole of the metallic cylinder 2. Cooling fins 7 project from the outer surface of the cooling cylinder. Thus, a closed envelope, generally designated by reference numeral 9, is formed by connecting the cooling cylinder 8 to the metallic cylinder 2, and closing the remaining part thereof with the electrodes 6, the diaphragm 5, the annular insulator 3 and the welded ring 4 contacted with the flange 2a disposed at each open end of the metallic cylinder. The closed envelope 9 completely encloses the semiconductor element 1 and a liquid coolant 10 with a space being provided at the upper part, so as to dip the semiconductor element. The liquid coolant 10 referably has characteristics of high electrical insulation and a boiling point near the working temperature of the semiconductor element.

A spherical plate spring 11 contacts the flat outer surface of each electrode 6, and three or four clamping bolts 12 are inserted through the peripheral parts of the spring and nuts 13 are screwed on each end of the clamping bolts. The reference numerals 14 and 15 designate, respectively, an insulating cylinder and an insulating washer for insulating the bolts 12 and the nuts 13 from the spherical plate spring 11 contacting the electrode 6.

In structure constructed as described herein, the cooling effect of the semiconductor element 1 given as follows:

When the semiconductor element 1 is heated by feeding current thereto, the temperature of the electrode 6, which works also as a radiator disposed on both surfaces, increases to begin boiling of the liquid coolant 10 contacted with the electrode. In the case, the heat generated from the semiconductor 1 is lost as a latent heat of vaporization of the liquid coolant 10, whereby the semiconductor element 1 is highly cooled. The vaporized coolant 10 rises to the cooling cylinder 8 disposed as the upper part of the closed envelope 9, and the coolant is cooled on the inner surface of the cooling cylinder 8 being cooled by the cooling fins 7 thereof, and is then condensed and liquefied to lose the heat, whereupon the liquid coolant falls down along the inner surface of the cooling cylinder 8 to return to the metallic cylinder 2 at the lower part of the closed envelope 9.

The effective cooling of the semiconductor element 1 can be attained by repeating the vaporization and liquefication of the liquid coolant 10 in the closed envelope 9.

Moreover, in accordance with this feature of the embodiment, the miniaturization of the device while maintaining its light weight, and the simplification of assembling the same, can be attained by a combination of the envelope and the pressing mechanism in one body.

With regard to assembling the envelope 9, the semiconductor element 1 is supported from both sides by the pair of electrodes 6 connected to the diphragm 5, the annular insulator 3 and the welded ring 4, all in the metallic cylinder 2, and then the welded rings 4 are welded to the flanges 2a at both end openings of the metallic cylinder 2. Accordingly, the semiconductor element 1 is in the condition kept in the metallic cylinder 2. The lower aperture end of the cooling cylinder 8 is inserted in the upwardly disposed central hole in the periphery of the metallic cylinder, and the inserted part thereof is welded to complete the assemblage of the closed envelope 9.

In this case, the sealing and connecting part can be sealed by other suitable methods, such as by an O-ring sealing method. Incidentally, in the contact of the semiconductor element 1 with the electrode 6, it is preferable to maintain the condition wherein the semiconductor element 1 is supported so as to prevent slippage of the contacting surfaces, that is to apply the elastic pressing force of the diaphragm 5 to the semiconductor element 1.

As stated above, a part of the closed envelope 9 is formed by the electrodes 6 pressing the semiconductor element 1 from both sides, and the spherical plate springs 11 are contacted with the flat outer surface of the electrodes, being pressed by the clamping bolts 12, which are inserted about the peripheral parts of the sperical plate springs and clamped with the nuts 13, whereby the device is assembled.

The spherical plate springs 11 are prepared by shaping suitable spring material and improving the limit of elasticity by shot-peening to form a partial spherical shape, as shown by the broken line, under a no load condition. The shape and curvature of the spherical plate springs are designed so as to form a flat shape, as shown by the full-line, under the load required for clamping the nuts 13. Thus, the spherical plate springs 11 are used as pushing plates for applying suitable pressure to the semiconductor element 1 and through the electrodes 6, and also for the absorbing change of pressure caused by the thermal expansion of the parts, through the elastic property of the springs.

The central part of each of the spherical plate springs 11 is a part of the spherical surface at the initiation of the clamping thereof to provide an automatic centering action, and the central part becomes flat upon increase of pressure thereto, whereby uniform pressure is advantageously applied to all contacting surfaces of the semiconductor 1.

The change of stress between the metallic cylinder 2 and the electrodes 6, by the change of outer pressure and the thermal expansion of the parts, can be absorbed by the expansion and contraction of the diaphragm 5 disposed between the cylinder and the electrodes, whereby mechanical strain of the metallic cylinder 2 is not caused.

As stated above, in accordance with the invention the electrodes 6 serve as a current output terminal and also as a radiator for the semiconductor element, as well as being a part of the compressing mechanism, and are disposed in a part of the closed envelope 9 enclosing the semiconductor element 1, which must be cooled. Accordingly, the structure is remarkably simplified when compared to that of the prior devices which comprise a closed envelope separated from the stack enclosing the semiconductor element, and the assemblage is remarkably simple. In comparison with the conventional device comprising a stack in an envelope, as is clear from FIG. 1, the semiconductor element supporting part of the closed envelope 9, that is the metallic cylinder 2, is formed in one body together with the pressing mechanism comprising the spherical plate springs 11, the clamping bolts 12, and the nuts 13, whereby the outer size of the device can be remarkably decreased.

Moreover, the amount of liquid coolant 10 enclosed in the lower part can be small because of the decrease in the size of the closed envelope 9, and the total weight of the device can also be decreased together with the outer size of the device.

In the conventional device, the shape of the envelope is limited, such as the bottom of the envelope comprising a stack being made flat so as to fit to the stack having a rectangular shape. However, in accordance with the present invention, the semiconductor element supporting part, that is, the metallic cylinder, can be advantageously designed in various shapes without being limited to a circular cylinder, so as to miniaturize the closed envelope 9.

In the conventional device, it has been necessary to equip the same with an insulating sealed terminal which is passed across the wall in order to feed the current while insulating a current terminal of the semiconductor element from the envelope. In accordance with the invention, the electrode 6 is contacted with the semiconductor 1 in the inner part of the closed envelope 9 and the other end of the electrode is exposed outside the envelope, and the current of the semiconductor element can be easily fed out from the outer exposed part of the electrode. Accordingly, in the device of the present invention, it is unnecessary to use an insulating sealed terminal, whereby the structure of the envelope can be simplified and assemblage of the device is easy.

Incidentally, in the embodiment described herein, the part enclosing the semiconductor 1 is formed by the metallic cylinder 2 and the annular insulator 3 disposed at both ends of the metallic cylinder. However, it is possible to form them as one hollow insulator. Moreover, the elctrode 6 is used as a radiator for the semiconductor element 1, however, it is possible to provide a radiator separated from the electrode. Also, only one semiconductor element 1 is shown being disposed in the closed envelope 9, however, it is possible to enclose a plurality of such semiconductor elements in the envelope, such as to alternatively arrange the semiconductor elements and radiators thereof to connect them in series.

In accordance with the present invention, the advantages of miniaturization and the light weight of the device achieve simplification of assembling the device and the cooling effect thereof is remarkably higher than that of the conventional device, while the semiconductor element is completely enclosed in the closed envelope. Accordingly, a vapor cooled semiconductor device which has high reliability without being limited by the conditions of environment is attained.

Obviously, many modifications and variations of the invention are possible in light of these teachings. It is to be understood therefore that within the scope of the appended claims, the invention may be practiced otherwise than as specifically described herein.

What is claimed as new and desired to be secured by Letters Patent of the U.S. is:

1. A vapor cooled semiconductor device, comprising:
   an envelope having at least one aperture;
   at least one semiconductor element enclosed in said envelope;
   an electrode contacting said semiconductor element and disposed within said aperture of said envelope so as to define a gap between said electrode and said envelope;
   expandable sealing means insulatively disposed between and in contact with said electrode and the wall of said envelope so as to seal the gap therebetween;
   resilient pressing means disposed about said envelope and in contact with said electrode so as to support said semiconductor element through said electrode under pressure; and
   a liquid coolant enclosed in said closed envelope, but not filling the same, to cool said semiconductor element by the latent heat of vaporization thereof.

2. The vapor cooled semiconductor device according to claim 1, wherein said electrode forms a current output terminal at an exposed end thereof.

3. The vapor cooled semiconductor device according to claim 1, wherein said sealing means comprises a diaphragm, disposed through an insulator, between said electrode and said wall of said envelope.

4. The vapor cooled semiconductor device according to claim 1, wherein said pressing means comprises a spherical plate spring, the convex part of which is in contact with said electrode.

5. A vapor cooled semiconductor device comprising:
   a cylinder defining a pair of apertures;
   at least one semiconductor element disposed within said cylinder;
   a pair of electrodes clamping said semiconductor element therebetwwen and disposed within said apertures of said cylinder so as to define a gap between said electrodes and said cylinder;
   expandable sealing means, disposed through an insulator, between and in contact with said electrodes and the wall of said cylinder so as to seal the gap therebetween;
   resilient pressing means disposed outside said cylinder and in contact with said electrodes so as to support said semiconductor element through said electrodes under pressure;
   a liquid coolant enclosed in said cylinder; and
   cooling means secured to said cylinder and open thereinto to provide a space for expansion of said liquid coolant and vaporization thereof to cool said semiconductor element by the latent heat of vaporization of said coolant.

6. The vapor cooled semiconductor device according to claim 5, wherein said pair of electrodes form current output terminals at their exposed ends.

7. The vapor cooled semiconductor device according to claim 5, wherein said sealing means comprises a diaphragm, disposed through said insulator, between each of said electrodes and said wall of said cylinder.

8. The vapor cooled semiconductor device according to claim 5, wherein said pressing means comprises a spherical plate spring, the convex part of which is contacted with each of said electrodes.

9. The vapor cooled semiconductor device according to claim 8, wherein said pressing means comprises a pair of spherical plate springs connected by clamping means and being electrically insulated from each other.

* * * * *